(12) United States Patent
Che

(10) Patent No.: US 6,194,274 B1
(45) Date of Patent: Feb. 27, 2001

(54) METHOD OF FABRICATING A MASK ROM

(75) Inventor: Shyng Yeuan Che, Hsinchu-Hsien (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/503,693

(22) Filed: Feb. 14, 2000

(30) Foreign Application Priority Data

Aug. 10, 1999 (TW) .............................................. 088113617

(51) Int. Cl.[7] .............................................. H01L 21/8242

(52) U.S. Cl. .............................................................. 438/278

(58) Field of Search ........................... 438/278, FOR 208

(56) References Cited

U.S. PATENT DOCUMENTS 5,946,576 * 8/1999 Wen .

FOREIGN PATENT DOCUMENTS

0053654A2 * 6/1982 (EP) .

* cited by examiner

Primary Examiner—George Fourson
Assistant Examiner—Joannie A. Garcia

(57) ABSTRACT

A method of fabricating mask ROMs combines the code mask and via mask into a combination mask such that the isolation layers are removed to reveal the memory cells to be coded and the metal layers to be electrically contacted simultaneously, and the bury implantation process can be shifted and combined with the back-end process. Consequently, the delivery of mask ROM finished-products can be speeded, and the fabricating cost reduced.

19 Claims, 12 Drawing Sheets

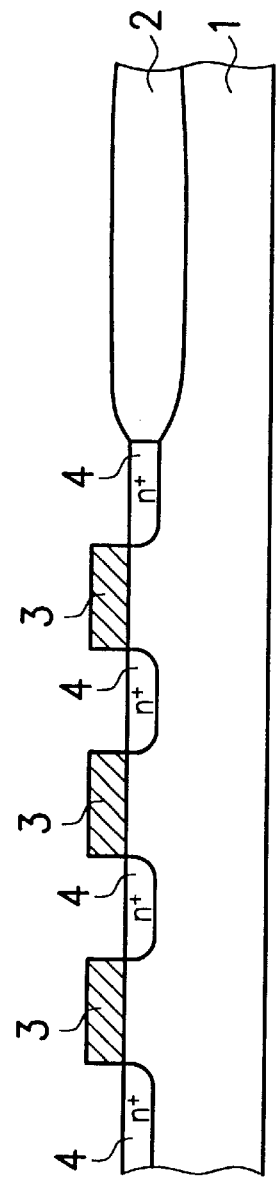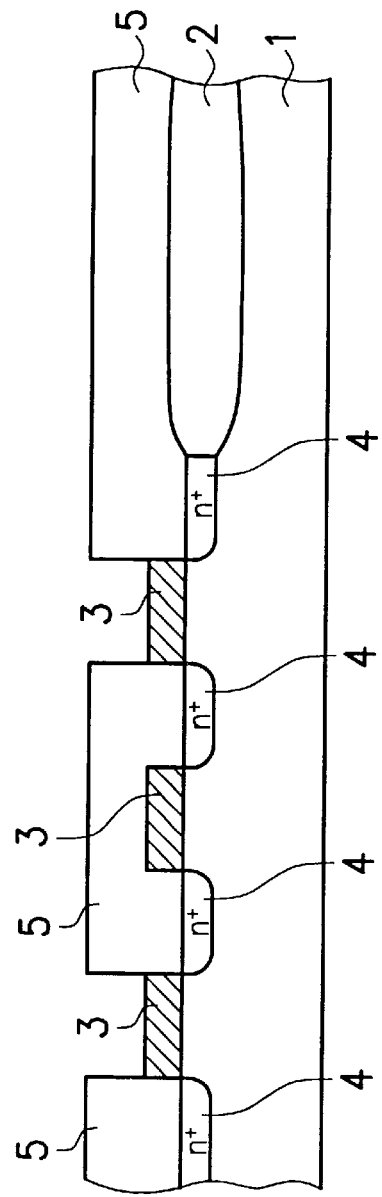
FIG. 1A (PRIOR ART)
FIG. 1B (PRIOR ART)

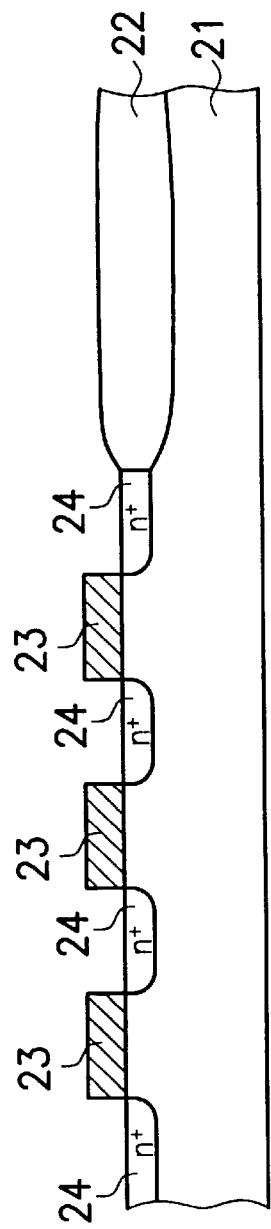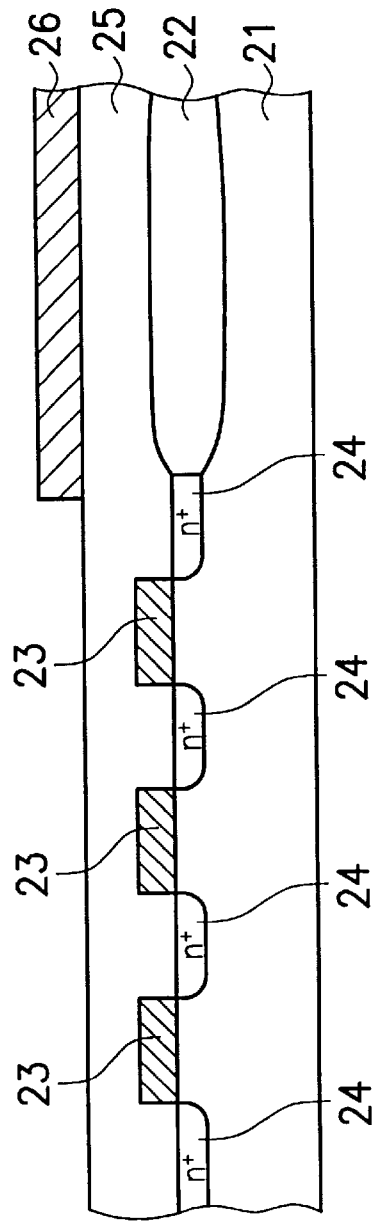
FIG. 2A
FIG. 2B

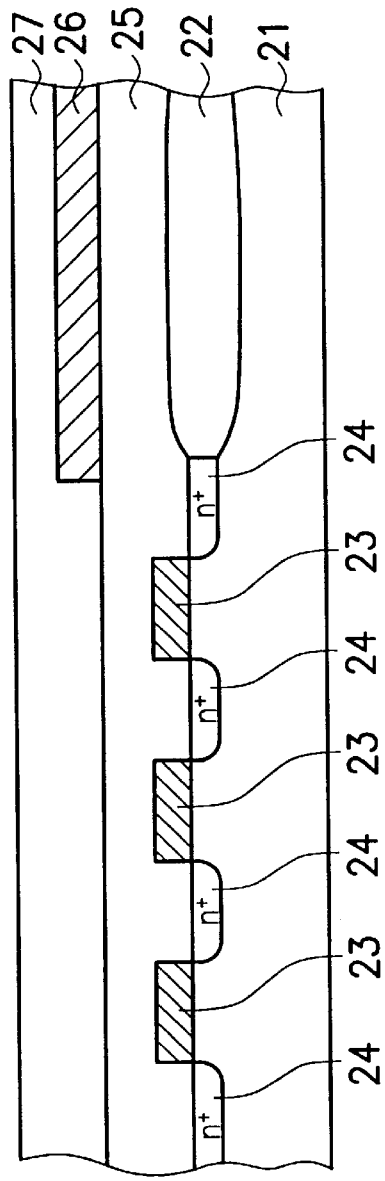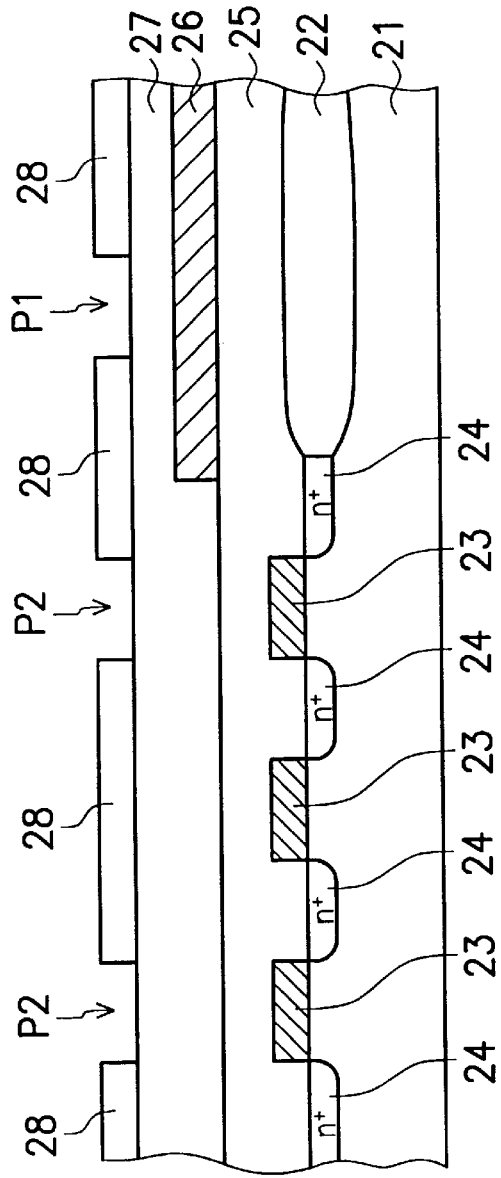

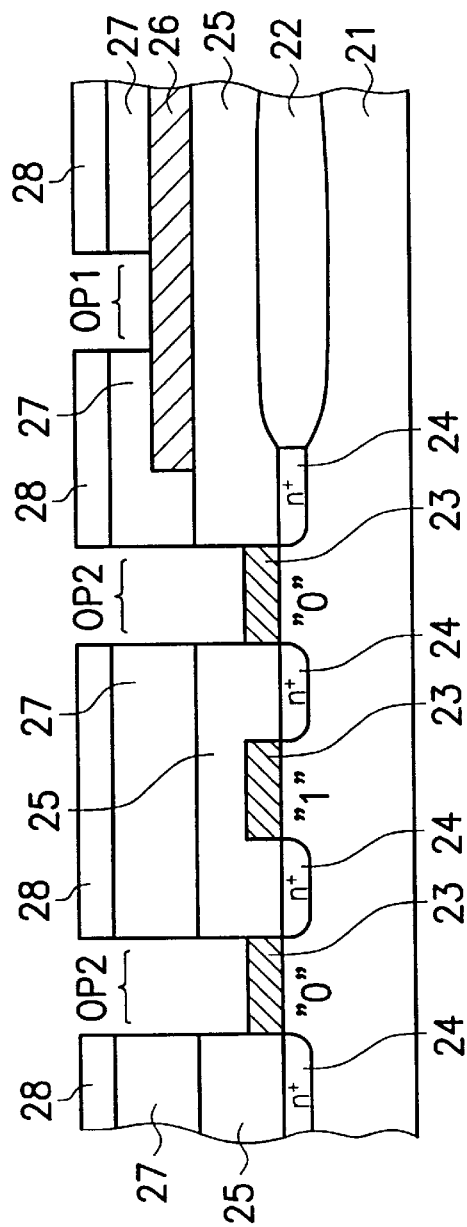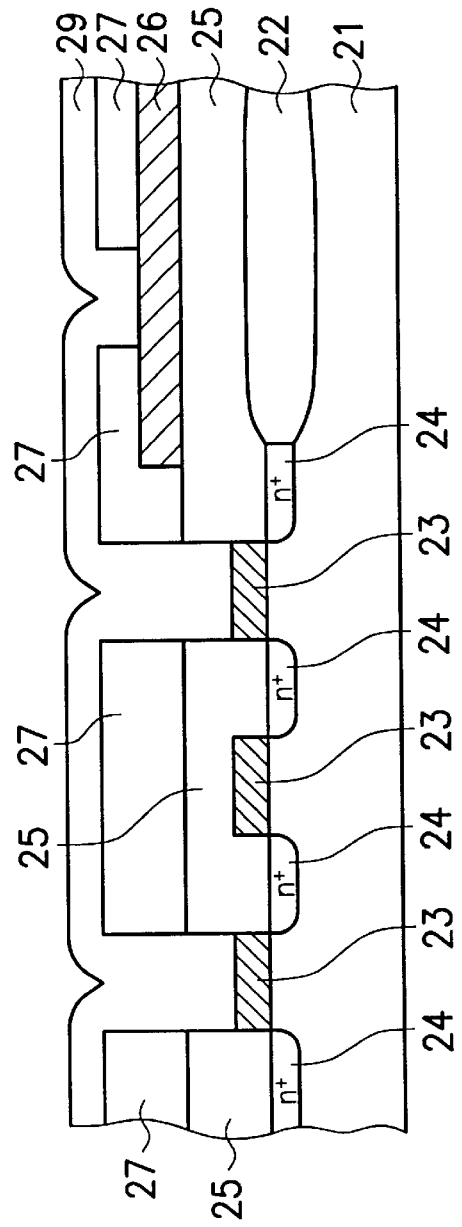

METHOD OF FABRICATING A MASK ROM

BACKGROUND OF THE INVENTION

1. Field of the Invention

The present invention relates to a method of fabricating a mask ROM by which the bury implantation step can be shifted and combined with the back-end process, thereby improving the efficiency of the delivery of mask ROMs.

2. Description of the Related Art

FIGS. 1A to 1C shows the conventional process of fabricating a mask ROM in cross-sectional view. First, a plurality of MOS transistors serving as memory cells are formed in a semiconductor substrate 1, as depicted in FIG. 1A. In FIG. 1A, numeral 2 indicates an isolation structure which is usually a field oxide layer formed via LOCOS method; numeral 3 indicates the polysilicon gate of one of the MOS transistors (the gate oxide layer is not shown) and numeral 4 indicates the source and drain ($n^+$ diffusion regions) of one of the MOS transistors. Next, a photoresist layer 5 is formed over the MOS transistors, and is then defined and patterned using a code mask in conjunction with photolithography, as depicted in FIG. 1B. Then, a bury implantation is carried out to complete the coding process of the mask ROM, as depicted in FIG. 1C.

In the bury implantation step, MOS transistors with their gates revealed by the photoresist layer 5 will be defined as the memory cells having coded data "0". On the other hand, MOS transistors with their gates covered by the photoresist layer 5 will be defined as the memory cells having coded data "1".

After the bury implantation step, subsequent back-end process steps are carried out such as: (a) removing the photoresist layer 5; (b) forming a BPSG layer over the MOS transistors; (c) carrying out a first metalization process; (d) forming a dielectric layer; (e) forming via holes by using a via mask; (f) carrying out a second metallization process etc., and finally forming a passivation layer.

IC manufacturers typically fabricate in advance a mask ROM prepared structure as described in FIG. 1A. When given orders for mask ROMs by customers, IC manufacturers start to fabricate the code mask according to a code specification required by the customers. Then, the code mask is used to pattern the photoresist layer to reveal the MOS transistors to be implanted (coded), as described in FIG. 1B. Next, the bury implantation process is carried out for encoding memory data, thereby completing the mask ROM required by the customers as described in FIG. 1C. However, the mask ROM can not deliver to the customers, until the steps (a)–(f) of the back-end process are performed. Consequently, the delivery of finished products (mask ROM) to the customers depends on the required time for completing the above process.

For IC manufacturers, prompt delivery of finished products means profits and competitive edge. If the bury implantation step can be shifted and combined with the back-end process, then the fabrication of mask ROMs can be simplified and the efficiency of delivery is improved.

SUMMARY OF THE INVENTION

Therefore, an object of the present invention is to provide a method of fabricating a mask ROM by which the bury implantation step can be shifted and combined with the back-end process thereby improving the efficiency of delivery of mask ROMs.

The present invention achieves the above-indicated objects by providing a method of fabricating a mask ROM that comprises the following steps.

First, a semiconductor substrate is provided with a plurality of memory cells formed therein; wherein each of the memory cells is a MOS transistor.

Secondly, a first isolation layer is formed over the memory cells; wherein the first isolation layer is a BPSG layer.

Then, a combination layer is formed over the first isolation layer; wherein the combination layer comprises a plurality of middle conduction layers and a plurality of middle isolation layers (or at least a middle isolation layer) overlapping mutually. For example, the combination layer is formed by the following steps: forming a first metal layer (metal-1); forming an isolation layer (iso-1) over the first metal layer (metal-1), wherein the isolation layer (iso-1) is patterned and etched to form connect holes therein and reveal the first metal layer (metal-1); and then forming a second metal layer (metal-2) over the isolation layer (iso-1) electrically contacting to the first metal layer (metal-1) via the connect holes. In this way, the combination layer is formed by the metal layers (metal-1, metal-2) and the isolation layer (iso-1) overlapping mutually.

Subsequently, a second isolation layer, for example a dielectric layer, is formed over the combination layer and the first conduction layer.

A photoresist layer is formed and patterned over the second isolation layer by using a combination mask in conjunction with photolithography process; wherein a first and second pattern defined in the combination mask are transferred onto the patterned photoresist layer.

Etching process is carried out using the patterned photoresist layer as an etching mask layer, whereby contact holes defined by the first pattern are formed in the second isolation layer and the middle isolation layers to reveal some of the middle conduction layers (metal-1 or metal-2), and encoding holes defined by the second pattern are formed in the second isolation layer, the middle isolation layers and the first isolation layer to reveal the gates of a portion of the MOS transistors (memory cells). Finally, a bury (or code) implantation process is performed to dope the gates of the MOS transistors in the encoding holes, therefore completing the encoding operation of a mask ROM.

Further, a metalization process is carried out to form a top metal layer electrically contacting to the middle conduction layers (such as metal-1 and metal-2) via the contact holes and filling each of the encoding holes.

In the conventional method of fabricating mask ROMs, a code mask is used to define the encoding holes (FIG. 1B), and a via mask is used during the back-end process to define the connect holes (or via holes) between the metal layers formed in metalization steps. According to the present invention, the via mask and the code mask are combined into the combination mask. Consequently, when the connect holes are formed to reveal the metal layers (metal-1 or metal-2) out of the middle isolation layer, the encoding holes are also formed to reveal some specific memory cells out of the first isolation layer (BPSG) and the middle isolation layers such that the memory cells can coded by the bury implantation process. In this way, the implantation process is shifted and combined with the back-end process, thereby speeding the delivery of finished products.

BRIEF DESCRIPTION OF THE DRAWINGS

The following detailed description, given by way of example and not intended to limit the invention solely to the embodiments described herein, will best be understood in conjunction with the accompanying drawings, in which:

FIGS. 1A to 1C show a portion of process for fabricating a conventional mask ROM, in cross-sectional view;

FIGS. 2A–2G show the fabricating process according to the first embodiment of the present invention, in cross-sectional view.

DETAILED DESCRIPTION OF THE PREFERRED EMBODIMENTS

Figure 1C:
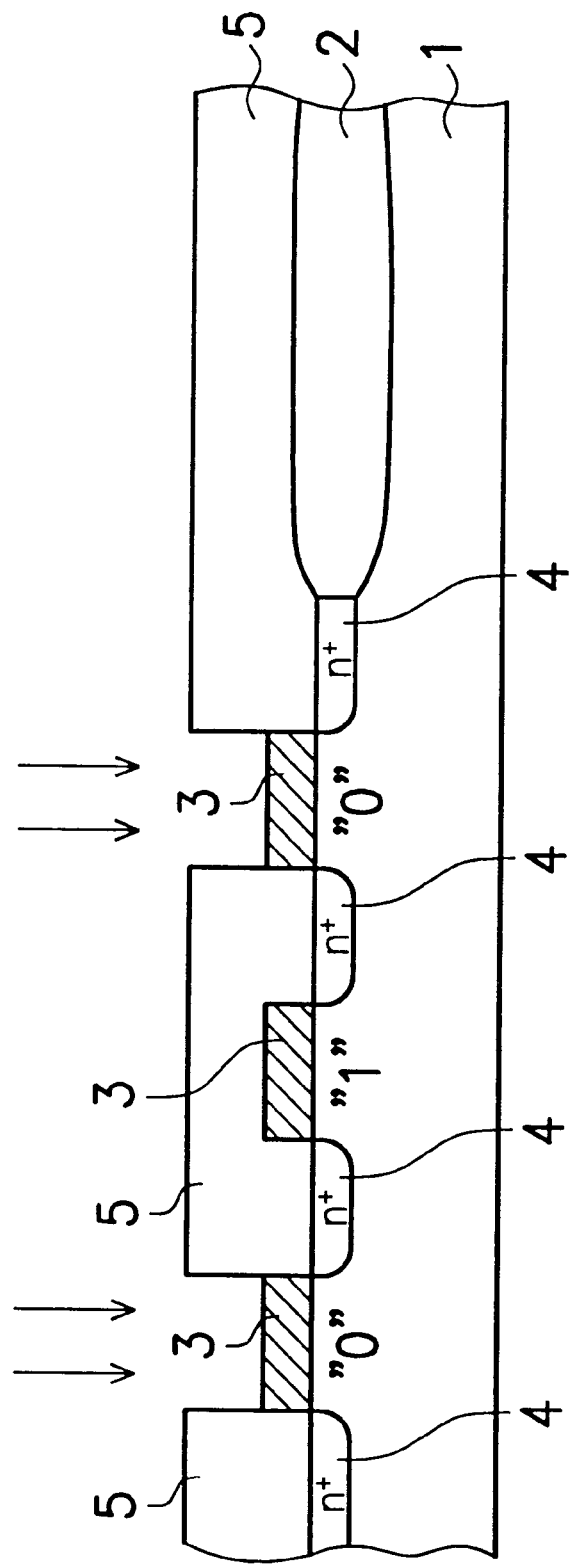

FIGS. 2A–2G show the fabricating process according to the first embodiment of the present invention, in cross-sectional view. The method of fabricating a mask ROM will be described in detail hereinafter referring to FIGS. 2A–2G.

First, a semiconductor substrate 21 with a plurality of memory cells formed therein are provided, wherein each of the memory cells is a MOS transistor. In FIG. 2A, numeral 22 indicates an isolation structure which is a field oxide layer formed by using LOCOS method; numeral 23 indicates the polysilicon gate of each of the MOS transistors (the gate oxide layer is not shown); and numeral 24 indicates the source/drain ($n^+$ diffusion regions) of each of the MOS transistors.

A first isolation layer 25 such as a BPSG layer is formed over the memory cells. Then, a first conduction layer 26 such as a metal layer (metal-1) is formed and patterned over the first isolation layer 25; as depicted in FIG. 2B.

Next, a second isolation layer 27 such as a dielectric layer is formed over the first isolation layer 25 and the first conduction layer 26; as depicted in FIG. 2C. For IC manufacturers, the half-finished mask ROM shown in FIG. 2C can serve as the prepared structure of a mask ROM.

Subsequently, a photoresist layer 28 is formed over the second isolation layer 27 and patterned using a combination mask in conjunction with photolithography process, thereby transferring a first pattern (P1) and a second pattern (P2) defined in the combination mask onto the patterned photoresist 28; as depicted in FIG. 2D. The first pattern P1 defines the opening and location of the connect holes. The second pattern P2 defines the locations of the memory cells to be coded (the gates to accept bury implantation) in the subsequent process.

An etching process is carried out using the patterned photoresist layer 28 as an etching mask layer, whereby a contact hole OP1 is formed in the second isolation layer 27 to reveal the first conduction layer 26, and encoding holes OP2 are formed in the second and first isolation layers (27, 25) to reveal the gates of a portion of the MOS transistors; as depicted in FIG. 2E.

Then, a bury implantation process is carried out to complete the coding process of the mask ROM. In the bury implantation step the memory cells (or MOS transistors) in the encoding holes OP2 will be defined as the memory cells having coded data "0". On the other hand, the memory cells (or MOS transistors) covered by the first and second isolation layers (25, 27) will be defined as the memory cells having coded data "1"; as shown in FIG. 2E.

Figure 2G:
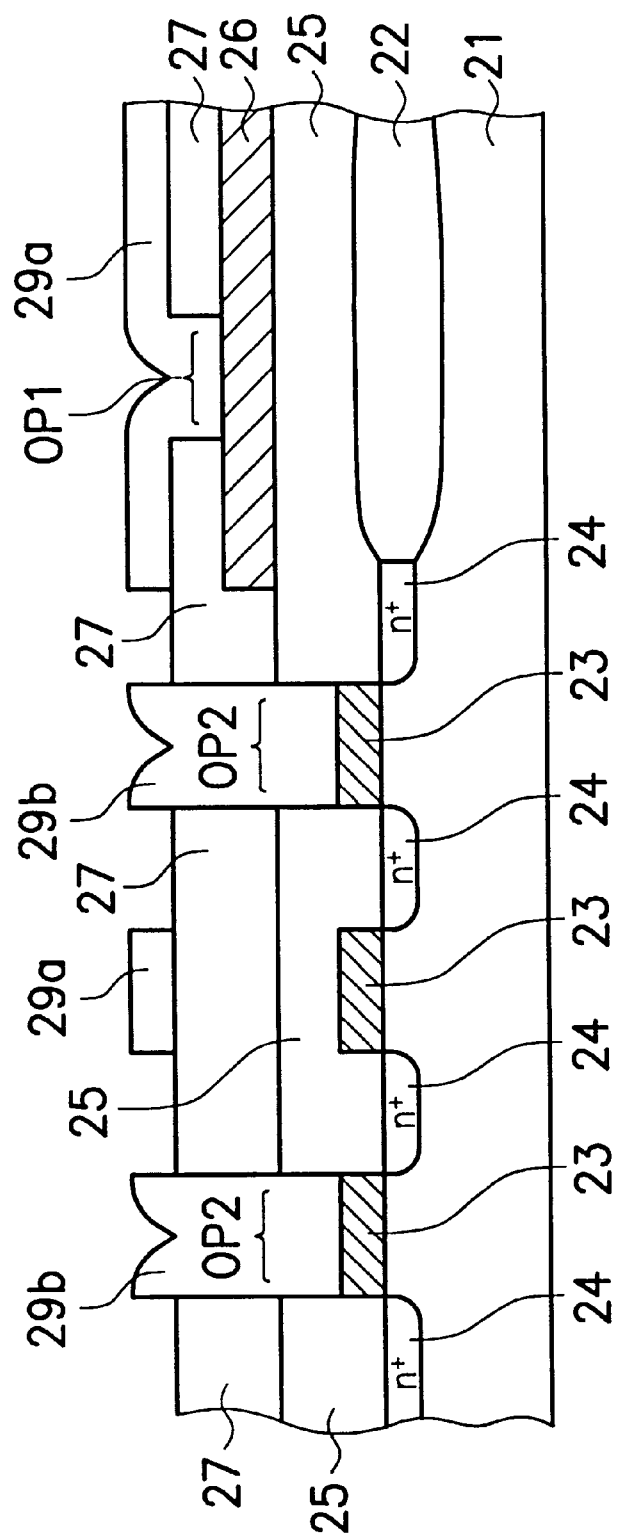

After the bury implantation step, a metallization process is performed to form a metal layer 29, as depicted in FIG. 2F. The metal layer 29 is defined and etched to form top metal layers (29a) electrically contacting to the first conduction layer 26 via the contact hole OP1, and filling each of the encoding holes OP2 with metal layers 29b; as depicted in FIG. 2G.

Finally, a passivation layer is formed to protect the mask ROM. The metal layer 29b remaining in the encoding holes OP2 can prevent large voids from forming in the encoding holes OP2 when depositing the passivation layer on the mask ROM.

From the above description, it is clear that the first isolation layer (BPSG) 25 and the second isolation layer (dielectric layer) 27 are simultaneously etched to reveal the memory cells of the mask ROM to be coded as data "0" when forming the connect holes (via holes) in the back-end process. Therefore, the bury implantation process is shifted and combined with the back-end process, and the conventional code mask is combined with the via mask to define connect holes. The present invention not only speeds the delivery of finished-products, but also reduces the fabrication cost (by saving a mask).

The first embodiment of the present invention is applied to fabricate double-metal mask ROMs. However, the present invention can be applied to fabricate multi-metal mask ROMs. The second embodiment of the present invention fabricating three-metal mask ROMs is described in detail hereinafter. However, it is understood that the present invention can be applied to multi-metal mask ROMs of any number.

FIGS. 3A–3G show the fabricating process according to the second embodiment of the present invention, in cross-sectional view. In FIGS. 3A–3G, the same or similar units as depicted in FIGS. 2A–2G are shown as the same numerals or notations.

Figure 3A:
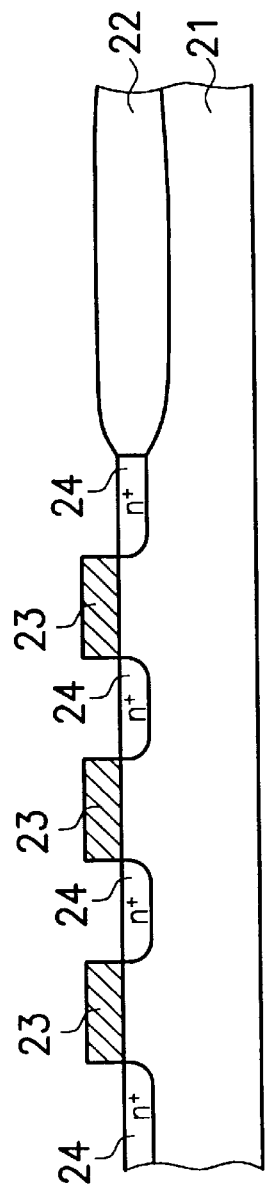
FIGS. 3A–3G show the fabricating process according to the second embodiment of the present invention, in cross-sectional view.

First, a semiconductor substrate 21 with a plurality of memory cells formed therein is provided, wherein each of the memory cells is a MOS transistor. In FIG. 3A, numeral 22 indicates an isolation structure which is a field oxide layer formed by using LOCOS method; numeral 23 indicates the polysilicon gate of each of the MOS transistors (the gate oxide layer is not shown) ; and numeral 24 indicates the source and drain ($n^+$ diffusion regions) of each of the MOS transistors.

Figure 3B:
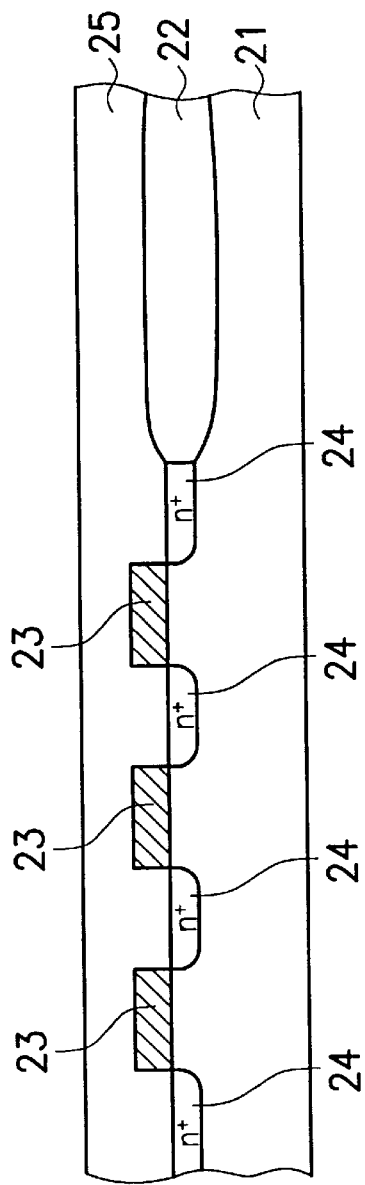

A first isolation layer 25, such as a BPSG layer, is formed over the memory cells, as shown in FIG. 3B.

Then, a combination layer 40 is formed over the first isolation layer 25. The combination layer 40 comprises a plurality of conduction layers (40a, 40c) and at least an isolation layer (40b) overlapping mutually. For example, the combination layer 40 is formed by the following steps: first patterning and forming a first metal layer 40a over the first isolation layer 25; then forming an isolation layer 40b over the first metal layer 40a and the first isolation layer 25; and patterning and forming a second metal layer 40c over the isolation layer 40b. In this way, the combination layer 40 is formed by the metal layers (40a, 40c) and the isolation layer (40b) overlapping mutually.

However, it is understood that the isolation layer 40b may be patterned and etched to form connect holes (no shown) therein to reveal the first metal layer 40a such that the second metal layer 40c can electrically contacted to the first metal layer 40a via the connect holes. In the second embodiment, there are no connect holes defined in the isolation layer 40b.

Figure 3C:
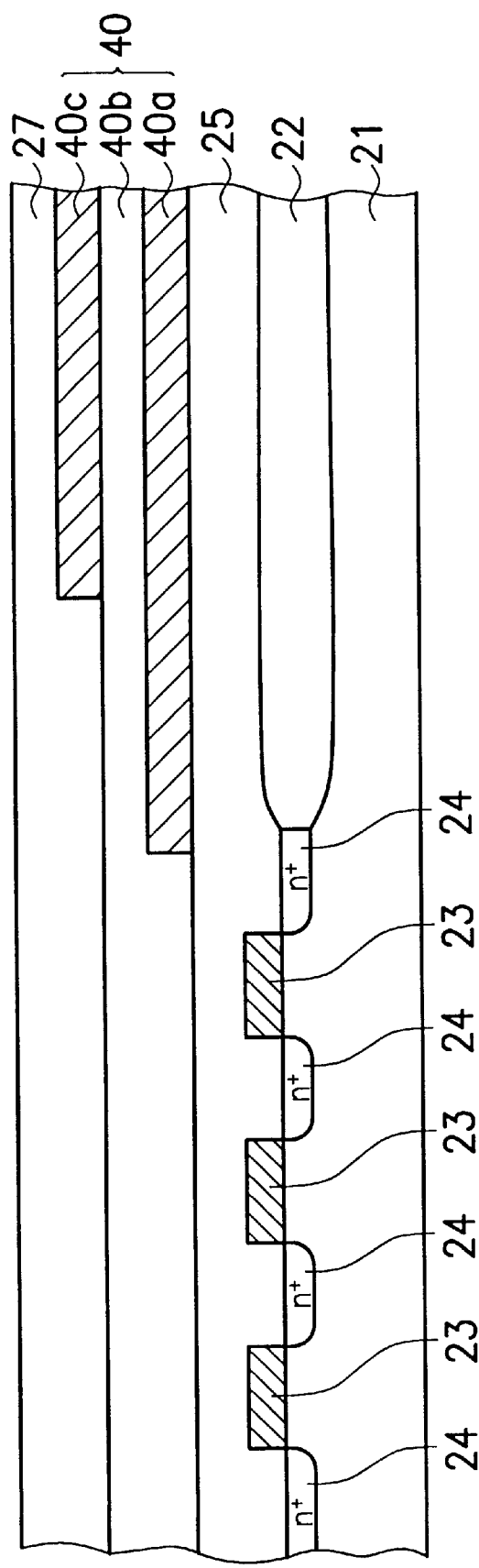

Next, a second isolation layer 27 such as a dielectric layer is formed over the combination layer 40; as depicted in FIG. 3C. For IC manufacturers, the half-finished mask ROM shown in FIG. 3c serves as the prepared structure of a mask ROM.

Figure 3D:
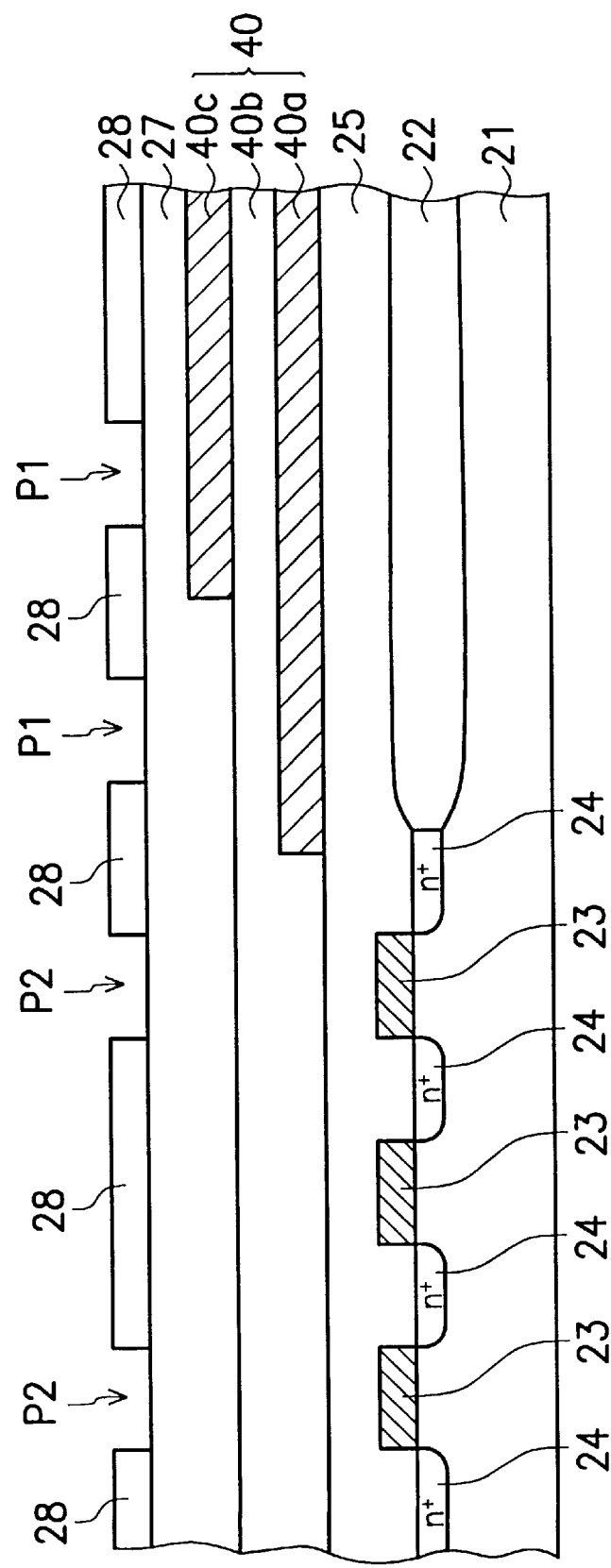

Subsequently, a photoresist layer 28 is formed over the second isolation layer 27 and patterned using a combination mask in conjunction with photolithography process, thereby transferring a first pattern (PI) and a second pattern (P2) defined in the combination mask into the patterned photoresist 28; as depicted in FIG. 3D. The first pattern P1 defines the opening and location of the connect holes (or via holes). The second pattern P2 defines the location of the memory cells to be coded (the gates to accept bury implantation) in the subsequent process.

Figure 3E:
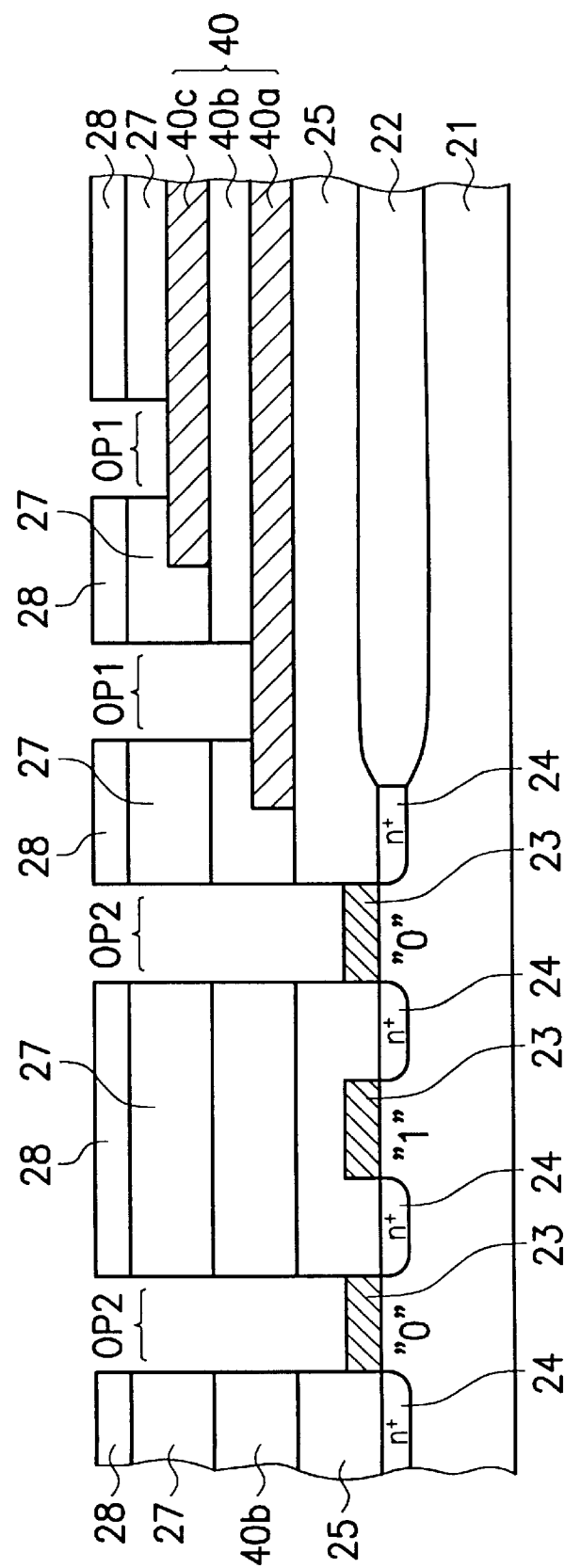

An etching process is carried out using the patterned photoresist layer 28 as an etching mask layer, whereby contact holes OP1 are formed in the second isolation layer 27 and/or the isolation layer 40b to reveal the metal layers (40c, 40a), and encoding holes OP2 are formed in the second and first isolation layers (27, 25) and the isolation layer 40b to reveal the gates of a portion of the MOS transistors; as depicted in FIG. 3E.

A bury implantation process is carried out to complete the coding process of the mask ROM. In the bury implantation step the memory cells (or MOS transistors) in the encoding holes OP2 will be defined as the memory cells having coded data "0". On the other hand, the memory cells (or MOS transistors) covered by the isolation layers (25, 40b, 27) will be defined as the memory cells having coded data "1"; as shown in FIG. 3E.

Figure 3F:
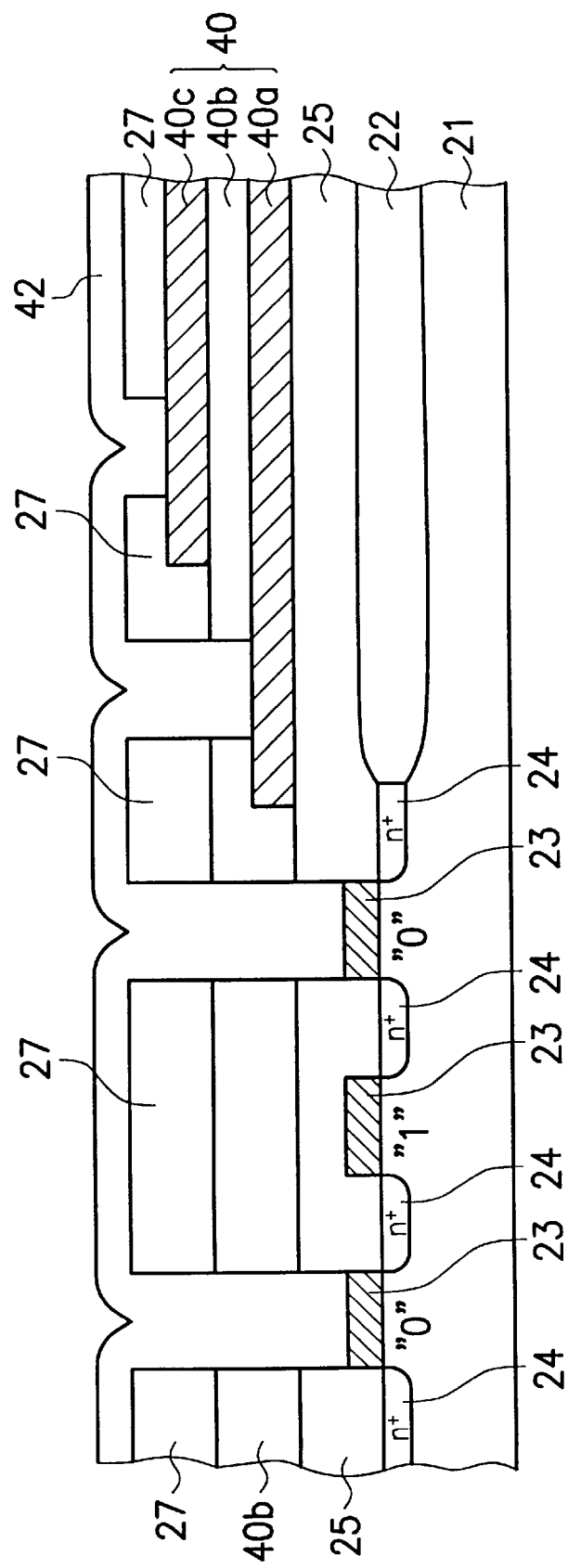
Figure 3G:
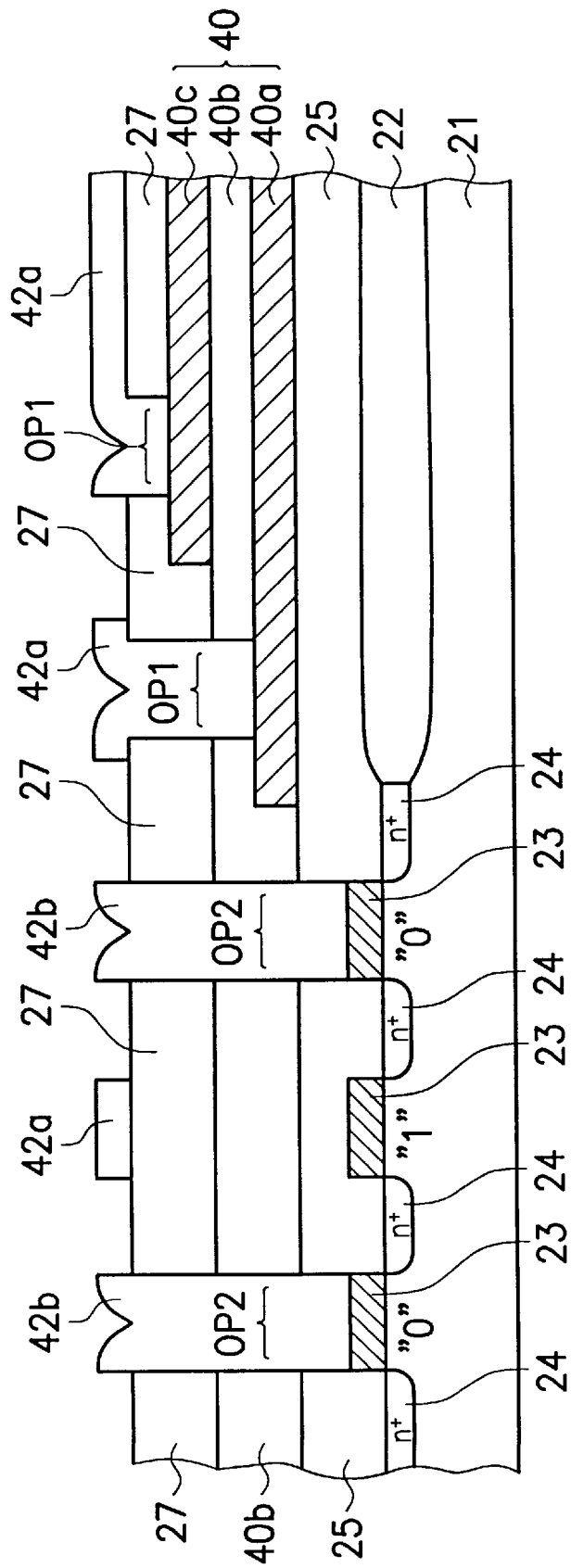

After the bury implantation step, a metallization process is performed to form a metal layer 42, as depicted in FIG. 3F. The metal layer 42 is defined and etched to form top metal layers (42a) electrically contacting to the first and second metal layers (40a, 40c) via the contact holes OP1, and filling each of the encoding holes OP2 with metal layers 42b; as depicted in FIG. 3G.

Finally, a passivation layer is formed to protect the mask ROM. The metal layer 42b remaining in the encoding holes OP2 can prevent large voids from forming in the encoding holes OP2 when depositing the passivation layer on the mask ROM.

Similarly, the bury implantation process is shifted and combined with the back-end process, and the conventional code mask is combined with the via mask to define connect holes. The present invention not only speeds the delivery of finished-products, but also reduces the fabrication cost (saving one mask).

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of fabricating a mask ROM comprising:
   providing a semiconductor substrate with a plurality of memory cells formed therein;
   forming a first isolation layer over said memory cells;
   forming a first conduction layer over said first isolation layer;
   forming a second isolation layer over said first isolation layer and said first conduction layer;
   patterning a photoresist layer over said second isolation layer;
   forming contact holes in said second isolation layer and forming encoding holes in said second and first isolation layers, thereby revealing said first conduction layer and a portion of said memory cells respectively, by carrying out etching process using said patterned photoresist layer as an etching mask layer; and
   performing implantation to said memory cells in said encoding holes.

2. The method as claimed in claim 1, wherein a metallization process is carried out after implantation to said memory cells, thereby forming a first metal layer electrically contacting to said first conduction layer via said contact holes and filling a second metal layer into each of said encoding holes.

3. The method as claimed in claim 1, wherein each of said memory cells is a MOS transistor.

4. The method as claimed in claim 1, wherein said first isolation layer is a BPSG layer.

5. The method as claimed in claim 1, wherein said second isolation layer is a dielectric layer.

6. The method as claimed in claim 1, wherein said first conduction layer is a metal layer.

7. A method of fabricating a mask ROM comprising:
   providing a semiconductor substrate with a plurality of memory cells formed therein, wherein each of said memory cells is a MOS transistor;
   forming a first isolation layer over said memory cells;
   forming a first conduction layer over said first isolation layer;
   forming a second isolation layer over said first isolation layer and said first conduction layer;
   patterning a photoresist layer over said second isolation layer by using a combination mask in conjunction with a photolithography process, thereby transferring a first pattern and a second pattern defined in said combination mask onto said patterned photoresist;
   forming contact holes in said second isolation layer and forming encoding holes in said second and first isolation layers, thereby revealing said first conduction layer and the gates of a portion of said MOS transistors respectively, by carrying out an etching process using said patterned photoresist layer as an etching mask layer; wherein said first and second patterns define said contact holes and encoding holes, respectively;
   performing implantation to the gates of said MOS transistors in said encoding holes.

8. The method as claimed in claim 7, wherein a metallization process is carried out after implantation to the gates of said MOS transistor, thereby forming a first metal layer electrically contacting to said first conduction layer via said contact holes and filling a second metal layer into each of said encoding holes.

9. The method as claimed in claim 7, wherein said first isolation layer is a BPSG layer.

10. The method as claimed in claim 7, wherein said second isolation layer is a dielectric layer.

11. The method as claimed in claim 7, wherein said first conduction layer is a metal layer.

12. A method of fabricating a mask ROM comprising:
    providing a semiconductor substrate with a plurality of memory cells formed therein;
    forming a first isolation layer over said memory cells;
    forming a combination layer over said first isolation layer; wherein said combination layer comprises a plurality of middle conduction layers and at least a middle isolation layer overlapping mutually;
    forming a second isolation layer over said combination layer;

patterning a photoresist layer over said second isolation layer;

forming contact holes in said second isolation layer and said middle isolation layer to reveal some of said middle conduction layers, and forming encoding holes in said second isolation layer, said middle isolation layer and said first isolation layer to reveal a portion of said memory cells, by carrying out an etching process and using said patterned photoresist layer as an etching mask layer; and performing implantation to said memory cells in said encoding holes.

13. The method as claimed in claim 12, wherein a metallization process is carried out after implantation to said memory cells, thereby forming a first metal layer electrically contacting to some of said middle conduction layers via said contact holes and filling a second metal layer into each of said encoding holes.

14. The method as claimed in claim 12, wherein each of said middle conduction layers is patterned.

15. The method as claimed in claim 14, wherein at least one of said middle conduction layers electrically contacts to another of said middle conduction layers according to the definition of the patterns of said middle isolation layer.

16. The method as claimed in claim 15, wherein two of said middle conduction layers formed over and below a specific middle isolation layer electrically contacts via the connect holes formed in said specific middle isolation layer.

17. The method as claimed in claim 12, wherein each of said memory cells is a MOS transistor.

18. The method as claimed in claim 12, wherein said first isolation layer is a BPSG layer, said second isolation layer and said middle isolation layer are dielectric layers.

19. The method as claimed in claim 12, wherein said middle conduction layers are metal layers, and said first conduction layer is a metal layer.

* * * * *